United States Patent
Mohamed et al.

(10) Patent No.: US 6,447,886 B1
(45) Date of Patent: Sep. 10, 2002

(54) BASE MATERIAL FOR A PRINTED CIRCUIT BOARD FORMED FROM A THREE-DIMENSIONAL WOVEN FIBER STRUCTURE

(75) Inventors: Mansour H. Mohamed, Raleigh; R. Bradley Lienhart, Cary; Pu Gu, Apex, all of NC (US)

(73) Assignee: 3Tex, Inc., Cary, NC (US)

( * ) Notice: Subject to any disclaimer, the term of this patent is extended or adjusted under 35 U.S.C. 154(b) by 0 days.

(21) Appl. No.: 09/528,621

(22) Filed: Mar. 20, 2000

(51) Int. Cl.⁷ .............................. B32B 3/00
(52) U.S. Cl. ................. 428/209; 442/205; 174/255; 428/901
(58) Field of Search .................. 442/203, 205; 428/209, 901; 174/255, 258

(56) References Cited

U.S. PATENT DOCUMENTS

| | | | |
|---|---|---|---|
| 4,725,485 A | * 2/1988 | Hirokawa | 428/225 |
| 4,966,801 A | * 10/1990 | Becker et al. | 428/113 |
| 5,085,252 A | 2/1992 | Mohamed et al. | |
| 5,269,863 A | 12/1993 | Middelman | |
| 5,465,760 A | 11/1995 | Mohamed et al. | |
| 5,520,999 A | * 5/1996 | Van Skyhawk et al. | 428/251 |
| 5,637,375 A | * 6/1997 | Hohman | 428/113 |
| 5,670,250 A | * 9/1997 | Sanville, Jr. et al. | 428/323 |
| 5,807,793 A | 9/1998 | Scari et al. | |

OTHER PUBLICATIONS

Clyde F. Coombs, Jr., "Base Materials," Printed Circuits Handbook, 4th ed., McGraw–Hill (New York), pp. 8.1–8.31, (1988), (No Month).

* cited by examiner

*Primary Examiner*—Cathy Lam
(74) *Attorney, Agent, or Firm*—Jenkins & Wilson, P.A.

(57) ABSTRACT

A base material for a printed circuit board, and a printed circuit board constructed therefrom. The base material is formed from a three-dimensional orthogonally woven fabric having a crimp-free fiber architecture in the x-y plane and an integrated multi-layer structure. The base material comprises a first system of straight first fibers extending along a first direction in a first plane, a second system of straight second fibers extending along a second direction in a second plane parallel to the first plane, and a third system of third fibers extending along a third direction through the first and second systems and binding the first and second fibers thereof. A filler material coats a portion of the first, second and third systems. The printed circuit board comprises the base material and one or more conductive layers attached to surfaces of the base material.

17 Claims, 7 Drawing Sheets

BASE MATERIAL FOR A PRINTED CIRCUIT BOARD FORMED FROM A THREE-DIMENSIONAL WOVEN FIBER STRUCTURE

TECHNICAL FIELD

The present invention is generally directed to printed circuit boards and, more particularly, to printed circuit boards exhibiting improved structural properties through the provision of a base material or substrate that is formed from an integrated, three-dimensional woven fiber structure.

BACKGROUND ART

Printed circuit boards, or PCBs, are typically provided in the form of copper-clad laminates consisting of three principal components: a base or reinforcing material; a resin system or matrix; and copper foil. Commonly employed base materials include paper, glass matte, woven glass cloth, quartz, and aramid material. In the typical process for manufacturing the laminated PCB, the base material is impregnated or coated with a resin. The resin is then polymerized in a treater or coater to a state suitable for storage and final pressing. The base material is treated by passing it through a dip pan containing the resin, and subsequently passing the impregnated base material through a set of metering rollers, such as squeeze rollers, and in turn through a drying oven to cure or semi-cure the resin. The oven is of the air-circulating or infrared type, in which most of the volatile compounds such as solvents residing in the resin are driven off. The resulting product is often referred to as a prepreg. Rigorous process control is exercised during treating in order to monitor the ratio of resin to base material, the final thickness of the prepreg, and the degree of resin polymerization. Once the prepreg has been prepared, the copper foil is applied to one or two sides of the prepreg, typically by the process of electrodeposition.

Important criteria in the production of printed circuit boards include prevention of delamination, punchability and machinability (especially drillability), uniformity of dielectric strength, tensile strength and modulus, surface flatness, dimensional stability, and measling and blistering (often caused by entrapped moisture resulting from poor drill hole quality). Dimensional stability in the lengthwise and crosswise dimensions x, y is a function of the laminate reinforcement (e.g., glass or paper), while vertical or thickness expansion in the z-direction is generally a function of the resin system or matrix. Some prior approaches to improving these properties have been concerned with improving the process of manufacturing the PCB as generally described above, while other approaches have focused on improving the structure of the base material itself.

The base material for PCBs has in the past been constructed from a multi-layer composite laminate. Laminates most widely used include materials designated FR-2, CEM-1, CEM-3, FR-4, FR-5, and GI. FR-2 laminates comprise multiple plies of paper that have been impregnated with a flame-retardant phenolic resin. FR-3 laminates comprise multiple plies of paper that have been impregnated with an epoxy-resin binder. CEM-1 is a composite having a paper core impregnated with epoxy resin. Its two planar surfaces are covered by woven glass cloth impregnated with the same type of resin. CEM-3 is a composite having an epoxy resin-impregnated non-woven fiberglass core with epoxy resin-impregnated woven glass cloth surface sheets. FR-4 laminates, perhaps the most widely used material in the PCB industry, include multiple plies of epoxy resin-impregnated woven glass cloth. FR-5 (military-type GH) laminates include multiple plies of woven glass cloth impregnated with mostly polyfunctional epoxy resin. GI laminates include multiple plies of woven glass cloth impregnated with a polyimide resin.

Woven laminates typically consist of several layers of two-dimensional plain weave fabric that have been impregnated with a resin system. One example of a layer of two-dimensional plain weave is illustrated in cross-section in FIG. 1. The fabric is produced in a "one-up, one-down" weaving process, wherein one set of fibers 1 disposed in the 0° (x-, warp or lengthwise) direction is interlaced with another set of fibers 2 disposed in the 90° (y-, weft, fill or crosswise) direction. Because of the interlaced configuration, all of the fibers contained in this type of fabric are necessarily crimped. It is known by those skilled in the art that the crimped structure significantly reduces the mechanical properties of the resulting fabric, such as the tensile strength and modulus. In addition, it is known that such fabric has an undesirably low dimensional stability since the crimped fibers are prone to stretching. Moreover, multi-layered composites formed from layers of two-dimensional fabric weaves are prone to delamination. Still further, in the manufacture of PCBs, the waved cross-sectional profile of crimped yarns creates a significant risk of deflection of the drill bit during drilling operations. Accordingly, it has become apparent in the industry that a better performing fabric is needed in the manufacture of the base material of a PCB. This need is especially significant in view of the fact that the density and complexity of the architecture of the modern PCB is increasing.

Figure 2:
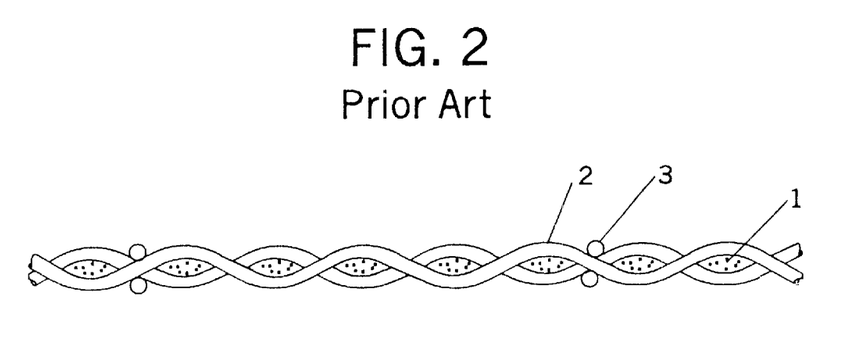
FIG. 2 is a cross-sectional view of another two-dimensional fabric known in the prior art.

Thus far, most approaches for producing an improved base material to adequately satisfy the requirements of modern PCB manufacture have focused on improving the structure of two-dimensional fabrics. One such approach has been to reduce the degree or extent of crimping and thereby improve the surface roughness, waviness, and evenness or flatness of the fabric. This has purportedly been accomplished by interlacing the crosswise yarns 2 of a textile fabric in its lengthwise direction with a leno interwoven binding comprising glass yarns 3, as illustrated in FIG. 2. A PCB is then produced from the resulting two-dimensional fabric base layer by conventional means, i.e., the fabric is treated with resin and a copper layer is placed on the surface of the top-most layer of the impregnated fabric. An example of this approach is disclosed in U.S. Pat. No. 5,807,793 to Scari et al. It can be seen, however, from FIG. 2 that all crosswise yarns 2 nevertheless remain interlaced with all lengthwise yarns 1 and, by necessity, all lengthwise yarns 1 remain interlaced with all crosswise yarns 2. Moreover, the pairs of leno interwoven yarns 3 are by definition interlaced with crosswise yarns 2. The resulting fabric is thus still characterized by crimped yarns and, in connection with the manufacture of PCBs, is subject to all of the deleterious effects attending crimped, two-dimensional designs.

Figure 3:
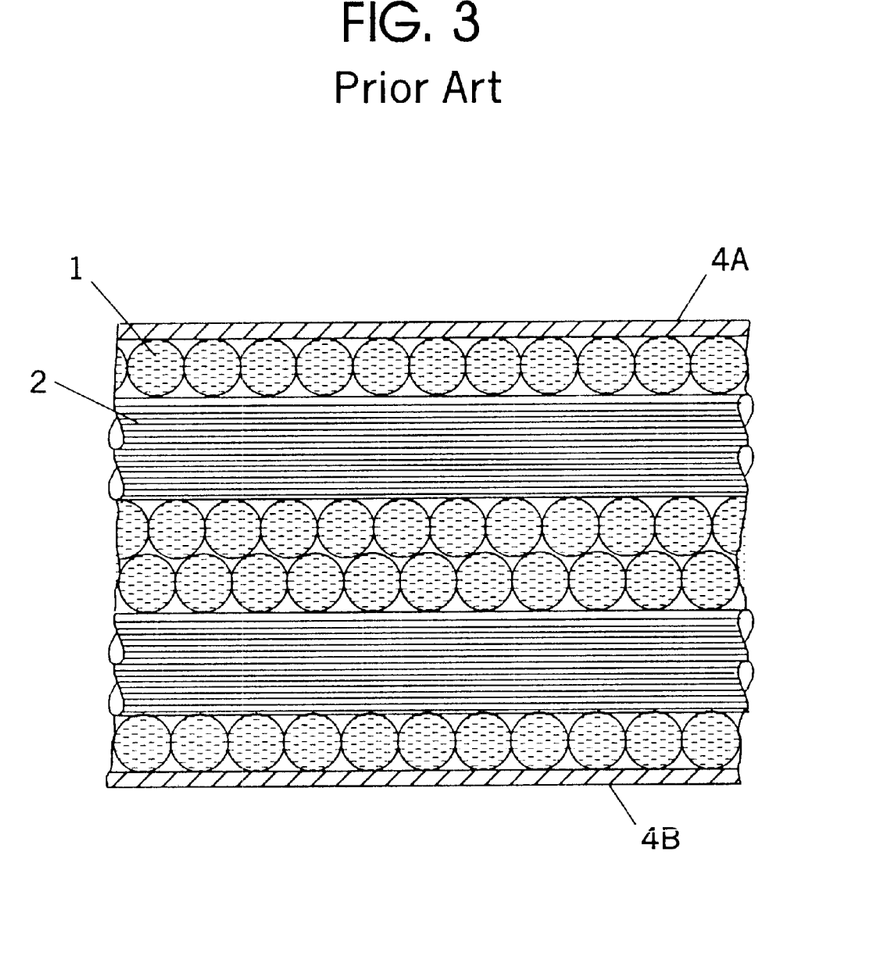
FIG. 3 is a cross-sectional view of yet another two-dimensional fabric known in the prior art.

Another approach is proposed in U.S. Pat. No. 5,269,863 to Middelman, which discloses a process wherein two-dimensional fiber laminates are provided in an entirely non-woven format. Referring to FIG. 3, double layers of crosswise threads 2 are laid in parallel relation and stretched under tension onto single and/or double layers of lengthwise threads 1, also laid in parallel relation and stretched under tension. All layers are thus formed without any interweaving or binding among the threads 1 and 2. The threads 1 and 2 utilized in this process are of an untwisted type such as E-glass filaments. Subsequently, the laminate is fed to a metering unit which impregnates the laminate with an epoxy resin and then to an infrared preheater to initiate curing. The impregnated laminate is then fed to a double belt press. As the laminate enters the double belt press, upper and lower copper foils 4A, 4B are respectively unwound from rollers onto upper and lower surfaces of the laminate. The composite laminate of filament layers and copper foils is passed through the double belt press under elevated pressure and temperature, and its continuous length is apportioned into discrete PCBs by a cutting device. It should be apparent that while the base material thus produced contains essentially crimp-free fibers, structural integrity is nonetheless compromised by the fact that the fibers are non-woven and hence bound only by the metered resin.

Figure 1:
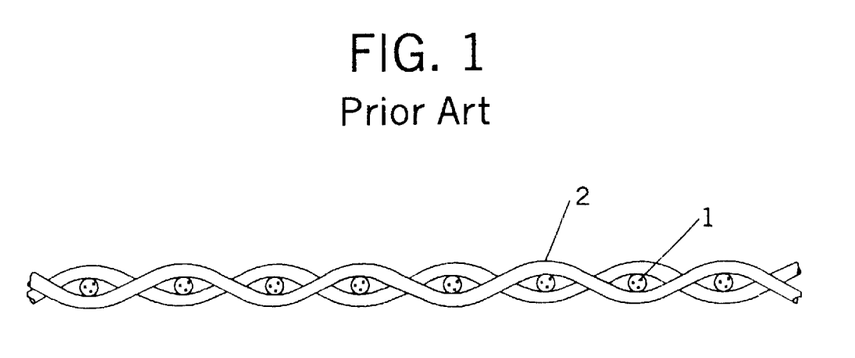
FIG. 1 is a cross-sectional view of a two-dimensional fabric known in the prior art.

A critical deficiency in prior art base materials such as those just described and illustrated in FIGS. 1–3, as well as related two-dimensional designs, is that their structural properties depend on the resin matrix to an unacceptable degree. That is, the resin matrix essentially serves as the primary structural component for the base material, while the fiber systems serve in merely in a reinforcing capacity. Closely related to this problem is the fact that these prior art base materials are laminates. Consequently, the resin matrix is also burdened with the task of binding several layers of two-dimensional fabric together and retaining the overall structural integrity of the PCB. As a result of these problems, base materials manufactured in the form of composite laminates, even those whose two-dimensional fabric layers are crimp-free as in FIG. 3, are quite prone to delamination. Structural failure of the base material can thus occur at many stages, such as during curing, drilling, or even during operations performed by others after the manufacture of the PCB has been completed. In addition, lamination is a labor intensive, expensive, and time consuming process.

Accordingly, there exists a long-felt need to provide a PCB having a base material that is not prone to delamination and that at the same time has improved properties relating to strength and drillability. To this end, applicants have found that the base material for a PCB can be constructed from a woven fabric having an integrated three-dimensional fiber structure with crimp-free fibers. Such a three-dimensional fiber structure can be formed in an essentially one-step process that is relatively inexpensive and non-labor intensive.

The resulting novel base material eliminates the risk of delamination and improves dimensional stability in all three dimensions, because its integrated three-dimensional structure, even if multi-layered, is not a laminate in the conventional sense since its fibers are bound together or interlocked in three dimensions. In the present invention, therefore, the fibers themselves are the true primary structural components of the base material, albeit a material such as resin can be added if desired in order to fill voids on the surface of the three-dimensional fabric and any interstices between the fibers within the core volume of the fabric. In addition, all fibers in at least the x-y plane of the novel base material are straight (i.e., crimp-free) so that the properties important to PCBs, e.g. drillability, dimensional stability, flatness, etc., are vastly improved.

Three-dimensional woven fabrics have been developed in the textile industry. In general, such a fabric has been formed by arranging warp yarns in multiple layers that define sheds therebetween. A plurality of needles containing doubled filling or weft yarns are simultaneously inserted a uniform distance into the warp sheds from one side thereof. The filling yarns are held on the opposite side of the warp sheds by a catch yarn which passes through the loops of the doubled weft or filling yarns and thus forms the fabric selvedge. The weft needles are then returned to their original position at one side of the warp yarn sheds after inserting the doubled filling yarns, and a reed is urged forwardly to beat-up and pack the yarns into a tight structure at the fell of the fabric. Next, a layer of vertical yarns is inserted into the fell of the three-dimensional fabric, and the reed is returned to its original remote position so that the entire weaving cycle may be repeated.

An innovative and improved method for weaving a variable cross-section three-dimensional fabric of the same general construction as the woven fabric described hereinabove defining a non-variable cross-section is disclosed in U.S. Pat. No. 5,085,252 to Mohamed et al. To applicants' knowledge, however, a base material for a printed circuit board having an integrated three-dimensional fiber structure, or a PCB constructed therefrom, has not heretofore been developed.

DISCLOSURE OF THE INVENTION

Accordingly, a three-dimensional orthogonal fabric having a crimp-free fiber architecture in the x-y plane and an integrated multi-layer structure is provided. In one embodiment according to the present invention, a base material for use in a printed circuit board is formed from a three-dimensional woven fabric. A first system of straight first fibers extends along a first direction in a first plane. A second system of straight second fibers extends along a second direction perpendicular to the first system in a second plane parallel to the first plane. A third system of third fibers extends along a third direction through the first and second systems and binds the first and second fibers thereof. A filler material coats at least a portion of the first, second and third systems.

One or more of the fiber systems can be constructed of different materials, such that the fabric has a hybrid structure. Also, it is preferable that a plurality of corresponding first and second systems forming multiple layers are provided, all of which are bound by the third system.

In another embodiment according to the present invention, a printed circuit board comprises a base material formed from three-dimensional woven fabric having a crimp-free fiber architecture. The base material includes a first system of straight first fibers extending along a first direction in a first plane, a second system of straight second fibers extending along a second direction perpendicular to the first system in a second plane parallel to the first plane, and a third system of third fibers extending along a third direction through the first and second systems and binding the first and second fibers thereof. A first layer of conductive material is attached to a first surface of the base material. Preferably, several layers including first and second systems are provided in the base material, and a filler material such as epoxy resin is added to coat at least a portion of the fibers of the first, second and third systems.

In yet another embodiment according to the present invention, a method is provided for manufacturing a printed circuit board. A base material is formed from three-dimensional woven fabric having a crimp-free fiber architecture in the x-y plane. The base material includes a first system of straight first fibers extending along a first direction in a first plane, a second system of straight second fibers extending along a second direction perpendicular to the first system in a second plane parallel to the first plane, and a third system of third fibers extending along a third direction through the first and second systems and binding the first and second fibers thereof. A first layer of conductive material is attached to a first surface of the base material. Preferably, the base material is formed from a plurality of first and second systems defining multiple layers that are integrated by the third system, and a filler material is added to at least a portion of the first, second and third systems.

It is therefore an object of the present invention to provide a base material for use in the manufacture of a printed circuit board, wherein the base material is formed from a three-dimensional orthogonal fabric having a crimp-free fiber architecture in the x-y plane and an integrated multi-layer structure.

It is another object of the present invention to provide a base material for a printed circuit board having improved properties such as drillability, dimensional stability, tensile strength and modulus and prevention against delamination, thereby representing a significant advance over composite laminates and other two-dimensional structures heretofore employed.

It is a further object of the present invention to provide a printed circuit board and method for manufacturing the same, which employs a base material having the aforementioned advantageous structure and properties.

Some of the objects of the invention having been stated hereinabove, other objects will become evident as the description proceeds when taken in connection with the accompanying drawings as best described hereinbelow.

DETAILED DESCRIPTION OF THE INVENTION

Figure 4A:
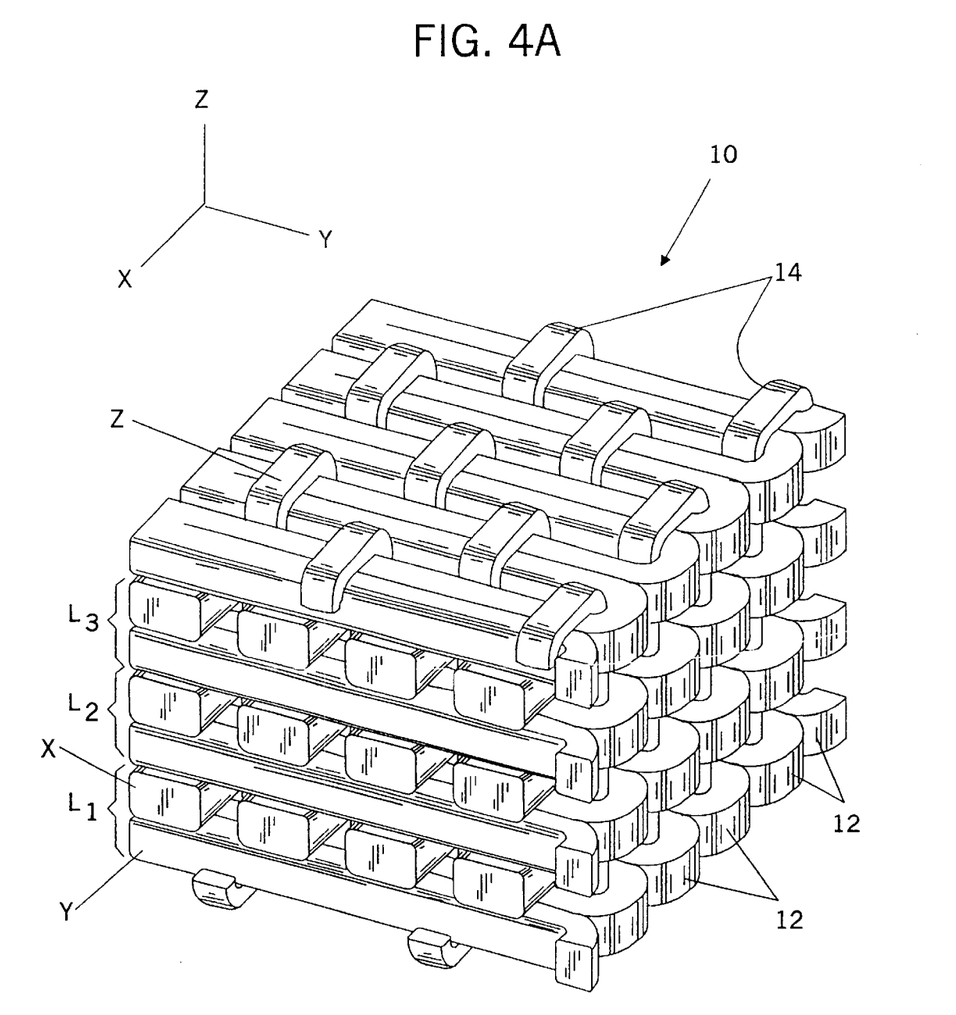
FIG. 4A is a perspective view of a volumetric section of a three-dimensional woven fabric used in a base material for a printed circuit board according to the present invention.
Figure 4B:
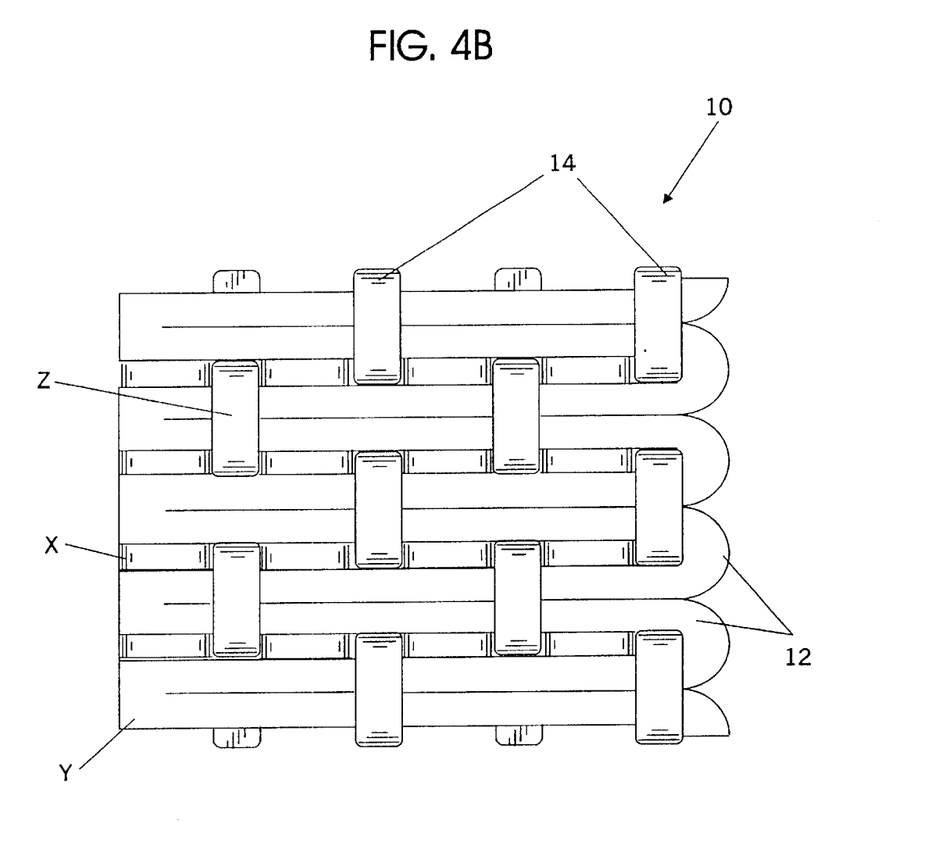
FIG. 4B is a top plan view of the fabric of FIG. 4A.
Figure 4C:
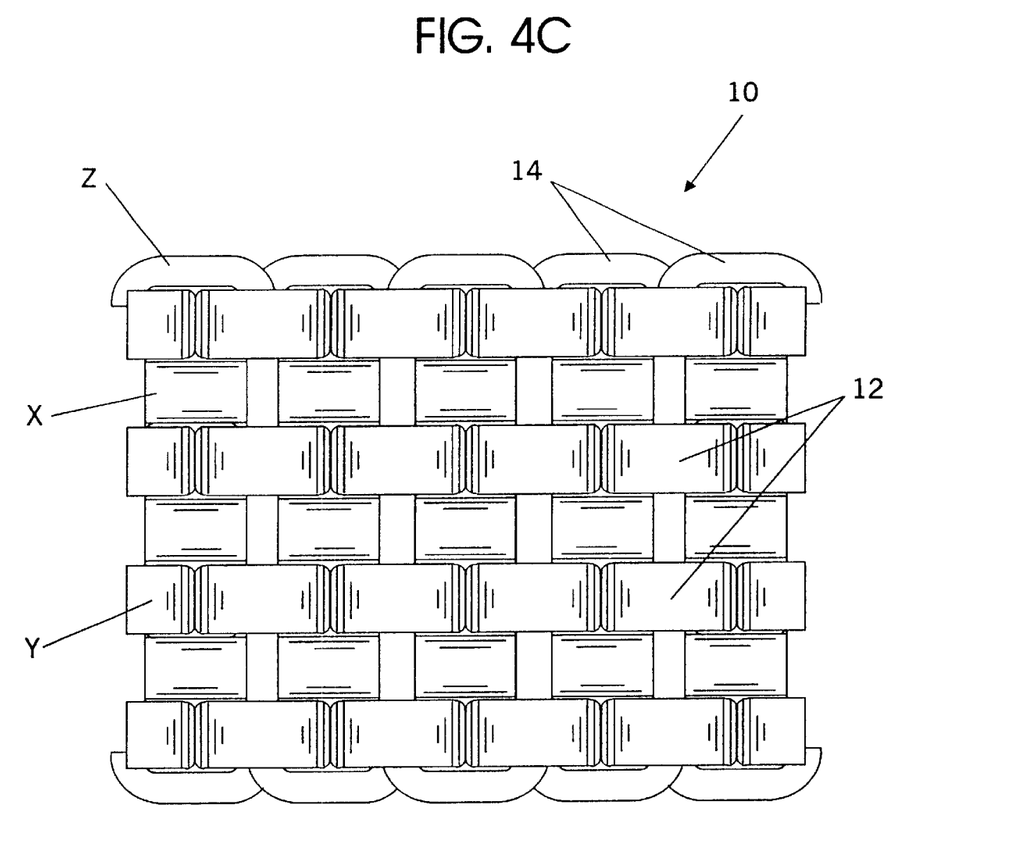
FIG. 4C is a side elevation view of the fabric of FIG. 4A.

Referring to FIGS. 4A–4C, a volumetric section of a three-dimensional woven fabric according to the present invention is shown and generally designated 10. Fabric 10 includes at least three primary systems of fibers. In the preferred embodiment, a first system includes a plurality of x-fibers (or warp fibers) X running straight and in a spaced parallel relation along the x-axis. A second system includes a plurality of y-fibers (or fill or weft fibers) Y running straight and in a spaced parallel relation along the y-axis. Preferably, y-fibers Y are actually one or more single, continuous fibers that are extended in one direction along the y-axis across the plane defined by the first system of x-fibers, and then made to reverse direction in a repeated manner around loops or curved sections 12 at the fold of fabric 10 so as to extend across the plane of the first system in the opposite direction. It is also preferable that x-fibers X and y-fibers Y, and thus the first and second systems, be disposed in a mutually orthogonal relation, such that the x- and y-axes are defined as in a Cartesian coordinate system.

The first and second systems cooperate to define a layer L of fabric, which layer L is disposed along a plane referred to as the in-plane. One or more layers $L_o \ldots L_n$ can be constructed in accordance with the present invention. Each layer L can be defined as including one system of x-fibers X and one system of y-fibers Y, except for the outermost surface layers where only y-fibers Y are present. The actual number of layers L will depend upon the desired thickness of the finished base material for the PCB.

A third system includes a plurality of z-fibers Z running in parallel relation through the planes of x-fibers X and y-fibers Y, such that z-fibers Z can be said to interconnect or bind the first and second systems and, in the case of a multiple-layered fabric, to interconnect or bind all layers L forming fabric 10. Preferably, z-fibers Z generally extend along the Cartesian z-axis such that z-fibers Z are mutually orthogonal to both x-fibers X and y-fibers Y or, stated differently, the third system is preferably disposed in an out-plane that is perpendicular to the in-plane defined by the first and second systems. Alternatively, or in addition to the orthogonal z-fibers Z, fabric 10 can include fibers running along a bias direction, or a direction angled with respect to the Cartesian axes. It is further preferable that z-fibers Z consist of one or more fibers which extend through the first and second systems in one direction along the z-axis and reverse direction in a repeated manner around curved sections 14 at the edge of fabric 10.

Many different types of materials can be used for x-fibers X, y-fibers Y, and z-fibers Z. These materials include, but are not limited to, organic fibrous material such as cotton, linen, wool, nylon, polyester, and polypropylene and the like; and inorganic fibrous materials such as glass fiber, carbon fiber, metallic fiber, asbestos and the like. The fibers can be either twisted, zero-twisted, or a combination of both. In addition, fabric 10 can be provided as a hybrid structure containing different types of fibers in one or more of the fiber systems. For example, x-fibers X could be E-glass, y-fibers Y could be an aramid, and z-fibers Z could be copper filament.

Preferably, the total fiber volume fraction, i.e., the percent by volume, of fabric 10 ranges from approximately 0.3 to approximately 0.6 and, more preferably, from 0.35 to 0.55. This can be tailored in each of the x-, y- and z-directions in order to adjust the properties of the overall three-dimensional structure of fabric 10. Additionally, each of the fibers forming fabric 10 preferably has a diameter in the range from approximately 5 to approximately 13 microns. Also, the linear density of the fibers is preferably within the range of approximately 10 to approximately 275 TEX.

Figure 5:
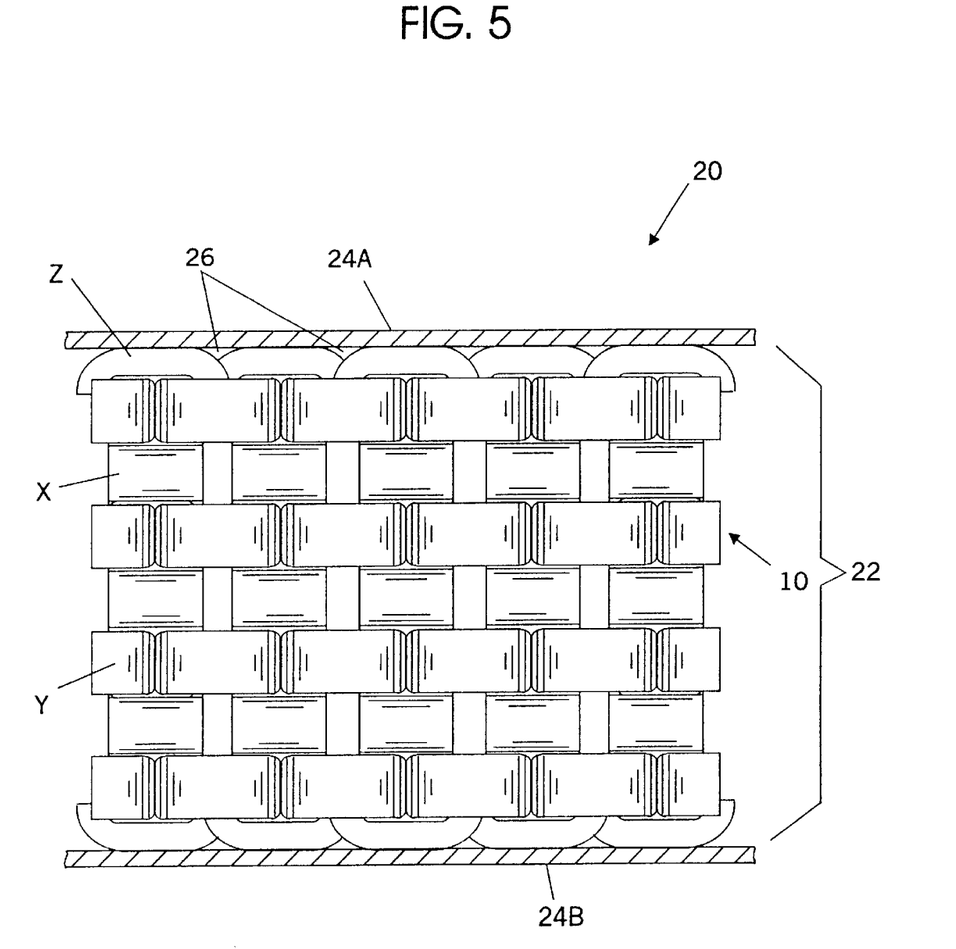
FIG. 5 is a sectional side view of a printed circuit board according to the present invention.

FIG. 5 illustrates an embodiment of a PCB generally designated 20 according to the present invention. PCB 20 includes a base material 22 comprising three-dimensional woven fabric 10, and one or more conductive layers 24A, 24B for which base material 22 serves as a supporting substrate. Conductive layer or layers 24A, 24B can be constructed from copper foil. Conductive layers 24A, 24B can be applied and adhered to base material 22 by a number of known methods, such as a subtractive process, an additive process or a combination thereof. PCB 20 can also include a filler material, or a binder material such as epoxy resin, in order to fill in voids 26 and further improve the surface flatness of fabric 10.

A number of advantages result from the provision of fabric 10 to form base material 22 of PCB 20. Importantly, all x-fibers X and y-fibers Y making up fabric 10 are completely straight and thus not crimped, the exception being those fibers looped at the outer surfaces of fabric 10.

It can be seen that within the three-dimensional core of fabric 10, z-fibers Z are substantially straight. It can also be seen that curved sections, 12 and 14 are quite straight in and of themselves, and thus do not significantly reduce the overall flatness of the outer surfaces. Also important is the fact that the strength and structural integrity of fabric 10, owing to its three-dimensional interlocking architecture, eliminates the risk of delamination of one or more layers L. By comparison, the failure of the resin matrix in prior art base materials significantly increases such risk. In addition, the size present on the fibers of fabric 10 is directly compatible with resin systems commonly used in the production of PCBs. As a further advantage, fabric 10 can be woven without the need for additional sizing, resulting in significant cost savings and simplification of the manufacturing process due to the elimination of the manufacturing steps of size application, finishing, and removal.

Figure 6:
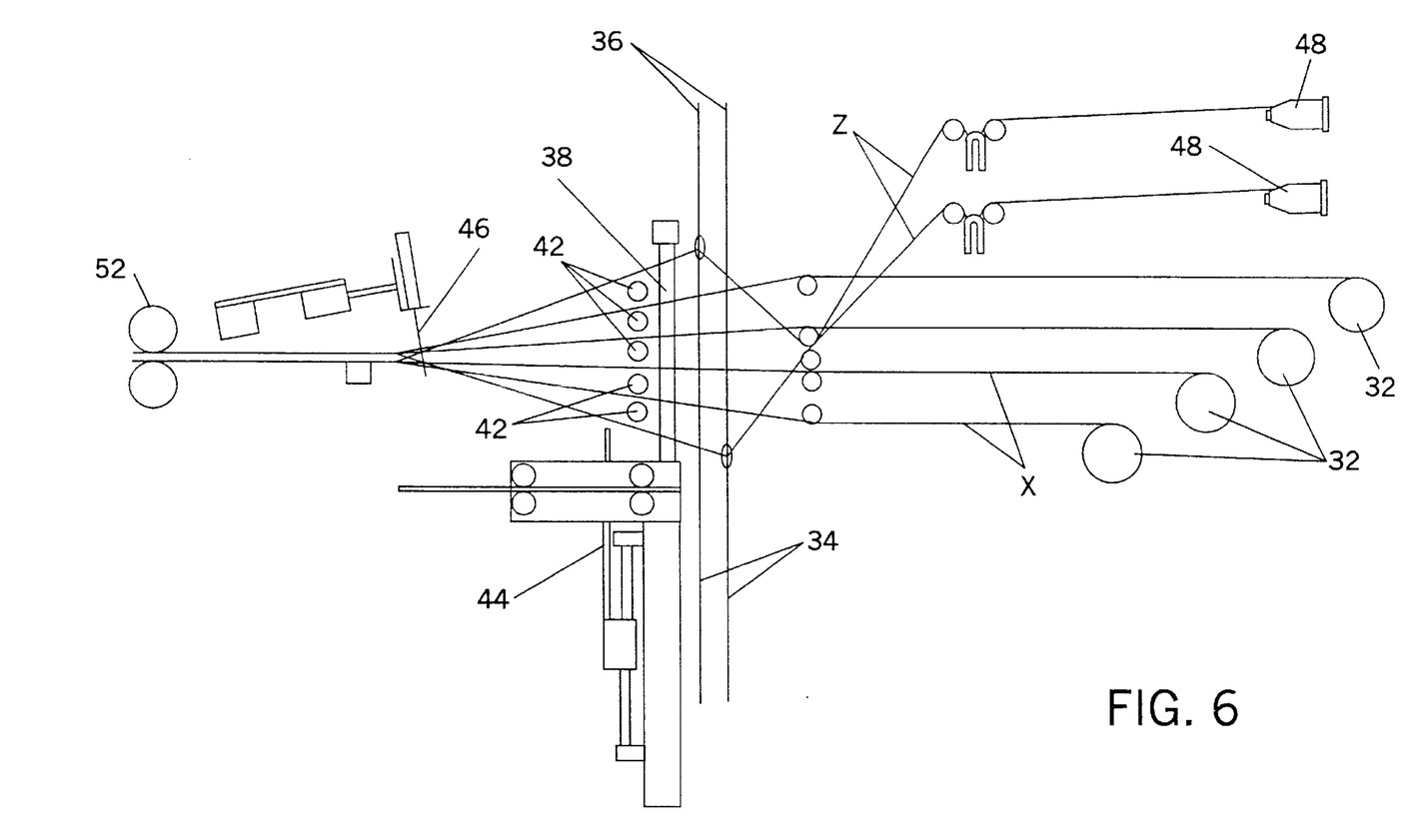
FIG. 6 is a schematic view of a process used in the manufacture of the base material for a printed circuit board according to the present invention.

The process by which fabric 10 is formed will now generally be described with reference to the schematic shown in FIG. 6. Lengthwise or x-fibers X are drawn under tension from an x-fiber feeding device 32 such as a set of warp beams (as shown) or a creel (not shown), between heddles 34 of harnesses 36, and through a beat-up reed 38, thereby forming systems of x-fibers X which are in horizontal and vertical alignment. Crosswise or y-fibers Y (not shown) are inserted between the systems of x-fibers X using fill insertion rapiers 42. Preferably, all y-fibers Y are inserted simultaneously in order to guarantee their straightness within the core of finished fabric 10 and to increase productivity. Beat-up reed 38 is actuated to apply force on y-fibers Y as fabric 10 is being formed, thereby packing x-fibers X and y-fibers Y into a tight structure. It will be understood that other devices, such as a conventional selvedge hold device 44 (for preventing the selvedge or edge on either side of the fabric from unraveling) and fill hold device 46 (for tensioning of y-fibers Y), are preferably employed in known manner during the forming of fabric 10.

Z-fibers Z are drawn under tension from a z-fiber feeding device 48 such a creel with bobbins (as shown) or one or more beams (not shown), and inserted through the layers formed by the systems of x-fibers X and y-fibers Y under the control of harnesses 36 with cross-moving heddles 34 and beat-up reed 38. Take-up roll 52 is used to advance fabric 10 forwardly. One specific and exemplary process and apparatus that can be utilized to form a preform such as fabric 10 is described in detail in U.S. Pat. No. 5,085,252 to Mohamed et al., which applicants incorporate herein by reference.

It thus can be seen that applicants have provided a printed circuit board and base material therefor having an improved three-dimensional, straight-fiber architecture and exhibiting improved properties such as drillability, dimensional stability, strength modulus and prevention against delamination, thereby representing a significant advance over composite laminates and other two-dimensional structures heretofore employed.

It will be understood that various details of the invention may be changed without departing from the scope of the invention. Furthermore, the foregoing description is for the purpose of illustration only, and not for the purpose of limitation—the invention being defined by the claims.

What is claimed is:

1. A printed circuit board comprising:
   (a) a base material formed from a three-dimensional woven fabric having a crimp-free fiber architecture in an x-y plane and including a first system of straight first fibers extending along a first direction in a first plane, a second system of straight second fibers extending along a second direction in a second plane parallel to the first plane, and a third system of third fibers extending along a third direction through the first and second systems and binding the first and second fibers thereof; and
   (b) a first layer of conductive material attached to a first surface of the base material.

2. The printed circuit board according to claim 1 wherein the base material has a multiple layered structure including a plurality of first and second systems, the first and second systems cooperatively defining a plurality of fabric layers, each fabric layer disposed in parallel relation to the other fabric layers and including one of the first systems and a corresponding one of the second systems, wherein the third system binds the plurality of layers.

3. The printed circuit board according to claim 1 further comprising a second layer of conductive material attached to a second surface of the base material.

4. The printed circuit board according to claim 1 wherein the first layer of conductive material is constructed from copper.

5. The printed circuit board according to claim 1 further comprising a filler material coating at least a portion of the first, second and third systems of the base material.

6. The printed circuit board according to claim 1 wherein the first fibers extend along a direction orthogonal to the direction of the second fibers.

7. The printed circuit board according to claim 6 wherein the third fibers extend along a direction orthogonal to the respective directions of the first and second fibers.

8. The printed circuit board according to claim 1 wherein the third fibers extend along a direction orthogonal to the first and second planes.

9. The printed circuit board according to claim 1 wherein the first fibers are constructed of a first material and the second fibers are constructed of a second material, and the second material is different from the first material.

10. The printed circuit board according to claim 9 wherein the third fibers are constructed of a third material and the third material is different from the first and second materials.

11. The printed circuit board according to claim 1 wherein the first fibers are constructed of a first material and the third fibers are constructed of a second material, and the second material is different from the first material.

12. The printed circuit board according to claim 1 wherein the total fiber volume fraction is in an approximate range of about 0.3 to 0.6.

13. The printed circuit board according to claim 12 wherein the total fiber volume fraction is in an open range of about 0.35 to 0.55.

14. The printed circuit board according to claim 1 wherein each fiber has a diameter in an approximate range of about 5 to 13 microns.

15. The printed circuit board according to claim 1 wherein each fiber has a linear density in an approximate range of about 10 to 275 TEX.

16. The printed circuit board according to claim 5 wherein the filler material is a binder material.

17. The printed circuit board according to claim 16 wherein the binder material is a resin.

* * * * *